(12) United States Patent
Lee et al.

(10) Patent No.: US 9,368,758 B2
(45) Date of Patent: Jun. 14, 2016

(54) SUBSTRATE FOR ORGANIC ELECTRONIC DEVICE

(71) Applicant: LG DISPLAY CO., LTD., Seoul (KR)

(72) Inventors: Jung Hyoung Lee, Daejeon (KR); Jun Rye Choi, Daejeon (KR); Duck Su Oh, Incheon (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/490,288

(22) Filed: Sep. 18, 2014

(65) Prior Publication Data

US 2015/0001522 A1    Jan. 1, 2015

Related U.S. Application Data

(63) Continuation of application No. PCT/KR2013/002706, filed on Apr. 1, 2013.

(30) Foreign Application Priority Data

Mar. 30, 2012    (KR) .................. 10-2012-0033512

(51) Int. Cl.
*H01L 51/52* (2006.01)
*H01L 51/00* (2006.01)
*H01L 51/56* (2006.01)

(52) U.S. Cl.
CPC ........ *H01L 51/5275* (2013.01); *H01L 51/0096* (2013.01); *H01L 51/5268* (2013.01); *H01L 51/56* (2013.01); *Y02E 10/549* (2013.01)

(58) Field of Classification Search
CPC . H01L 51/5275; H01L 51/56; H01L 51/5268; H01L 51/0096
See application file for complete search history.

(56) References Cited

U.S. PATENT DOCUMENTS

| | | | |
|---|---|---|---|
| 8,368,064 B2 | 2/2013 | Wada et al. | |
| 2006/0065989 A1* | 3/2006 | Druffel | B29C 35/0805 264/1.32 |
| 2009/0153972 A1* | 6/2009 | Nakamura | H01L 51/5268 359/599 |
| 2010/0187987 A1* | 7/2010 | Nakamura | H01L 51/5268 313/504 |
| 2011/0180308 A1* | 7/2011 | Nakamura | H01L 51/5268 174/255 |
| 2011/0278622 A1* | 11/2011 | Wada | C03C 3/16 257/98 |
| 2011/0298361 A1 | 12/2011 | Matsunaga et al. | |
| 2012/0025245 A1* | 2/2012 | Nakamura | C03C 8/08 257/98 |
| 2012/0194065 A1* | 8/2012 | Aoki | H01L 51/5268 313/504 |
| 2013/0026461 A1 | 1/2013 | Nakamura | |
| 2013/0114269 A1* | 5/2013 | Domercq | H01L 51/5215 362/311.05 |
| 2013/0134407 A1* | 5/2013 | Wada | C03C 3/19 257/40 |

FOREIGN PATENT DOCUMENTS

| | | |
|---|---|---|
| CN | 1818720 A | 8/2006 |
| CN | 101867020 A | 10/2010 |
| KR | 10-2006-0090617 | 8/2006 |
| KR | 10-2011-0113177 | 10/2011 |
| KR | 10-2011-0124314 | 11/2011 |

(Continued)

*Primary Examiner* — Michele Fan
(74) *Attorney, Agent, or Firm* — Dentons US LLP

(57) ABSTRACT

Provided are a substrate for an organic electronic device, and the like. The substrate for an organic electronic device having a functional layer which may improve a function such as light extraction efficiency of an organic electronic system such as organic light emitting device and stability of the device due to excellent cohesive strength to the substrate may be provided. An organic electronic system including the substrate and a use thereof may also be provided.

13 Claims, 7 Drawing Sheets

(56) References Cited

FOREIGN PATENT DOCUMENTS

| KR | 10-2012-0024510 | | 3/2012 | |
| TW | 201203649 | A1 | 1/2012 | |
| WO | 2011/126097 | | 10/2011 | |
| WO | 2012007575 | A1 | 1/2012 | |
| WO | WO 2012007575 | A1 * | 1/2012 | .......... H01L 51/5215 |
| WO | 2012033322 | A2 | 3/2012 | |

* cited by examiner

SUBSTRATE FOR ORGANIC ELECTRONIC DEVICE

This application is a Continuation Bypass of International Application No. PCT/KR2013/002706, filed Apr. 1, 2013, and claims the benefit of Korean Application No. 10-2012-0033512, filed on Mar. 30, 2012, all of which are hereby incorporated by reference in their entirety for all purposes as if fully set forth herein.

FIELD

The present application relates to a substrate for an organic electronic device (hereinafter, it may be referred to as an "OED"), an organic electronic system, a method of manufacturing the system or substrate, and lighting.

BACKGROUND

An OED is a device including at least one layer of an organic material capable of conducting a current. The OED includes an organic light emitting diode (OLED), an organic solar cell, an organic photo conductor (OPC), and an organic transistor.

Conventionally, an OLED, which is a representative OED, sequentially includes a substrate, a first electrode layer, an organic layer, and a second electrode layer. In a structure known as a bottom emitting device, the first electrode layer may be a transparent electrode layer, and the second electrode layer may be a reflective electrode layer. In addition, in a structure known as a top emitting device, the first electrode layer may be formed as a reflective electrode layer, and the second electrode layer may be formed as a transparent electrode layer. Electrons and holes injected by the electrode layers are recombined in the emitting layer located in the organic layer, resulting in generating light. The light may be emitted to the substrate in the bottom emitting device, or to the second electrode layer in the top emitting device. In the structure of the OLED, indium tin oxide (ITO) generally used as the transparent electrode layer, the organic layer, and the substrate, which is conventionally formed of glass, have refractive indexes of approximately 2.0, 1.8, and 1.5, respectively. In such a relationship of the refractive indices, for example, the light generated in the emitting layer in the bottom emitting device is trapped at an interface between the organic layer and the first electrode layer or in the substrate due to a total internal reflection phenomenon, and only a very small amount of light is emitted.

DESCRIPTION

Object

The present application is directed to providing a substrate for an OED, an organic electronic system, a method of manufacturing the substrate or system, and lighting.

Solution

One aspect of the present application provides an illustrative substrate for an OED, including: a glass substrate and a layer (hereinafter, referred to as simply a "functional layer") including a sintered product of a glass frit and scattering particles present therein, which is formed on the glass substrate. In one embodiment, the functional layer may serve to scatter, diffract or refract incident light with a high refractive layer or electrode layer to be described later when necessary.

FIG. 1 shows a functional layer including a sintered product 1021 and scattering particles 1022, which is formed on a glass substrate 101.

As the glass substrate, a known material may be used without particular limitation. For example, as the glass substrate, a substrate including soda lime glass, barium/strontium-containing glass, lead glass, alumino silicate glass, borosilicate glass, barium borosilicate glass, or quartz may be used, but the present application is not limited thereto. In addition, when necessary, a reflective layer using aluminum may also be formed on a surface of a base layer.

The sintered product included in the functional layer formed on the glass substrate may have a refractive index the same as or similar to that of the glass substrate. For example, the sintered product may have an absolute value of a difference in refractive index from the glass substrate of approximately 1.5, 1, 0.7, 0.5 or 0.3 or less. The term "refractive index" used herein may be a refractive index measured with respect to light having a wavelength of approximately 550 nm. Conventionally, the refractive index of the glass substrate is approximately 1.3 to 1.7 or 1.3 to 1.6, and thus the sintered product may also have a refractive index of approximately 1.3 to 1.7 or 1.3 to 1.6. As described above, the sintered product having a similar refractive index to the substrate may be combined with the scattering particles and/or a high refractive layer or electrode layer to be described later, thereby effectively scattering, refracting and/or diffracting light.

In the sintered product, the scattering particles are included. The term "scattering particles" used herein may refer to, for example, all kinds of particles capable of scattering, refracting or diffracting incident light since they have different refractive index from those of surrounding materials such as the sintered product or a high refractive layer or electrode layer to be described later and have a suitable size to scatter light. The scattering particles may be, for example, particles having the above-described refractive index and size. The scattering particles may have a higher refractive index than that of the sintered product. In addition, for example, the scattering particle may have a difference in refractive index from a planarized layer to be described later of more than 0.3 or 0.3 or more. For example, the scattering particle may have a refractive index of approximately 2.0 to 3.5 or 2.2 to 3.0. The scattering particles need to have a suitable diameter to scatter light. For example, an average diameter of the scattering particles may be approximately 50, 100, 500 or 1,000 nm or more. The average diameter of the scattering particles may be, for example, 10,000 nm or less.

In one embodiment, at least one of the scattering particles may have a diameter larger than the thickness of the functional layer. Here, the thickness of the functional layer may be a thickness of the functional layer other than the scattering particles, for example, a layer formed by the sintered product. An uneven structure or a curve may be formed in a surface of the functional layer using the scattering particles having a diameter larger than the thickness of the function layer as described above. The curve formed as described above may increase a function of the functional layer along with a high refractive layer or electrode layer to be described later.

The scattering particles may have a spherical, oval, polygonal or amorphous shape, but the shape thereof is not particularly limited thereto as long as the light may be scattered, refracted and/or diffracted. The scattering particles may include, for example, an organic material such as polystyrene or a derivative thereof, an acrylic resin or a derivative thereof, a silicon resin or a derivative thereof, or a novolac resin or a derivative thereof, or an inorganic material such as silica, alumina, titanium oxide or zirconium oxide. The scattering particles may include any one of the above materials, or at least two thereof, or may be formed in core/shell-type particles or hollow-type particles as needed.

A ratio of the scattering particles in the functional layer is not particularly limited as long as a desired function may be suitably expressed. For example, the scattering particle may be included in the functional layer at approximately 5 to 50 wt %. The unit "parts by weight" used herein may refer to, unless particularly defined otherwise, a weight ratio between components.

When necessary, a high refractive layer may be formed on the top of the functional layer. The term "high refractive layer" used herein may refer to a layer having a refractive index of approximately 1.7 or more, 1.8 to 3.5 or 2.2 to 3.0 with respect to light having a wavelength of 550 nm. The high refractive layer may be, for example, a planarized layer providing a planarized surface on which another component such as an electrode layer to be described later may be formed.

FIG. 2 shows that a high refractive layer 201 is formed on the functional layer described in FIG. 1.

The high refractive layer may be formed, for example, using a matrix material having a high refractive index or a material in which highly refractive particles are mixed with a matrix material.

As the matrix material, for example, a heat- or photo-curable monomeric, oligomeric, or polymeric organic material including polyimide, a caldo resin having a fluorene ring, urethane, epoxide, polyester, or acrylate, an inorganic material such as silicon oxide, silicon nitride, silicon oxynitride, or polysiloxane, or an organic/inorganic combination material.

The matrix material may include polysiloxane, poly(amic acid) or polyimide. Here, the polysiloxane may be formed by polycondensating, for example, a condensable silane compound or siloxane oligomer, and the matrix material may form a matrix based on a bond (Si—O) between silicon and oxygen. The polysiloxane may be formed only based on the siloxane bond (Si—O), or have some of organic groups such as an alkyl group or condensable functional groups such as an alkoxy group by controlling condensation conditions during the formation of the matrix material.

The poly(amic acid) or polyimide may have a refractive index of, for example, approximately 1.5, 1.6, 1.65 or 1.7 or more with respect to light having a wavelength of 633 nm. Such a highly refractive poly(amic acid) or polyimide may be prepared using, for example, a monomer to which a halogen atom other than fluorine, a sulfur atom or a phosphorus atom is introduced. For example, poly(amic acid) having a part capable of binding with particles such as a carboxyl group to enhance dispersion stability of the particles may be used. For example, the poly(amic acid) may be a compound including a repeating unit of Formula 1.

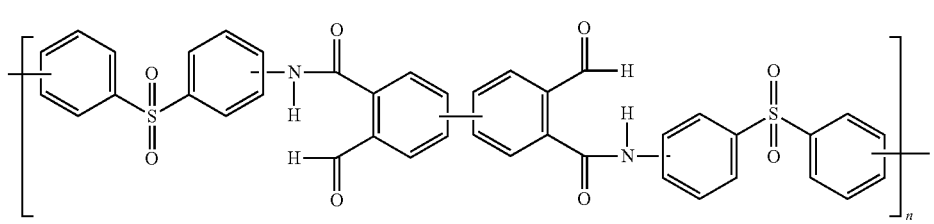

[Formula 1]

In Formula 1, n is a positive number.

The repeating unit may be arbitrarily substituted with at least one substituent. As the substituent, a halogen atom other than fluorine, or a functional group including a halogen atom, a sulfur atom or a phosphorus atom such as a phenyl group, a benzyl group, a naphthyl group or a thiophenyl group may be used.

The poly(amic acid) may be a homopolymer formed using only the repeating unit of Formula 1, or a block or random copolymer including another unit with the repeating unit of Formula 1. In the copolymer, the kind or ratio of another repeating unit may be suitably selected in the range in which, for example, a desired refractive index, thermal resistance or light transmittance is not inhibited.

As a particular example of the repeating unit of Formula 1, a repeating unit of Formula 2 may be used.

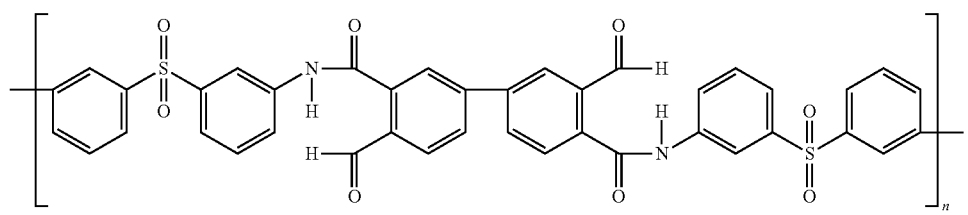

[Formula 2]

In Formula 2, n is a positive number.

The poly(amic acid) may have a weight average molecular weight converted by standard polystyrene measured by gel permeation chromatography (GPC) of approximately 10,000 to 100,000 or 10,000 to 50,000. The poly(amic acid) having the repeating unit of Formula 1 may also have a light transmittance in a visible region of 80, 85, or 90% or more, and have excellent thermal resistance.

The high refractive layer may include highly refractive particles. The term "highly refractive particles" used herein may refer to, for example, particles having a refractive index of 1.5, 2.0, 2.5, 2.6 or 2.7 or more. The upper limit of the refractive index of the highly refractive particles may be selected, for example, in the range satisfying a desired refractive index. The highly refractive particle may have, for example, an average diameter smaller than that of the scattering particles. The highly refractive particles may have, for example, an average diameter of approximately 1 to 100, 10 to 90, 10 to 80, 10 to 70, 10 to 60, 10 to 50 or 10 to 45 nm. The highly refractive particles may be alumina, alumino silicate, titanium oxide or zirconium oxide. As the highly refractive particles, for example, as particles having a refractive index of 2.5 or more, rutile-type titanium oxide may be used. The rutile-type titanium oxide may have a higher refractive index than that of other particles, and thus may be controlled to a desired refractive index in a relatively small ratio.

The high refractive layer may be formed using a material prepared by blending a compound such as an alkoxide or acrylate of a metal such as zirconium, titanium or cesium with a binder having a polar group such as a carboxyl group or a hydroxyl group. The compound such as an alkoxide or acrylate may be condensed with the polar group of the binder, and provide the metal to a backbone of the binder, thereby embodying a highly refractive index. Examples of the alkoxide or acrylate compound may include a titanium alkoxide such as tetra-n-butoxy titanium, tetraisopropoxy titanium, tetra-n-propoxy titanium or tetraethoxy titanium, a titanium acylate such as titanium stearate, a titanium chelate, a zirconium alkoxide such as tetra-n-butoxy zirconium, tetra-n-propoxy zirconium, tetraisopropoxy zirconium or tetraethoxy zirconium, a zirconium acylate such as zirconium tributoxystearate, or a zirconium chelate. In addition, the high refractive layer may be formed by preparing a coating solution by blending a metal alkoxide such as titanium alkoxide or zirconium alkoxide with a solvent such as an alcohol or water, coating the coating solution, and condensing the coated solution at a suitable temperature by sol-gel coating.

The substrate for an OED may further include an electrode layer formed on the top of the functional layer or functional layer and the high refractive layer.

FIGS. 3 and 4 show an illustrative substrate including a structure in which a functional layer 301 including a sintered product and scattering particles and an electrode layer 302 are sequentially formed on a base layer 101. As shown in FIGS. 3 and 4, the functional layer 301 may have a smaller projection area than that of the base layer 101, and the electrode layer 302 may have a larger projection area than that of the functional layer 301. The term "projection area" used herein refers to a projection area of a target recognized when the substrate is observed from above or below in a direction parallel to a normal line of a surface thereof, for example, an area of the base layer, the functional layer or the electrode layer. Accordingly, for example, even though a substantial surface area is larger than that of the electrode layer because a surface of the functional layer is formed in an uneven shape, when an area recognized by observing the functional layer from above is smaller than that recognized by observing the electrode layer from above, it is construed that the functional layer has a smaller projection area than that of the electrode layer.

The functional layer may be present in various types when it has a smaller projection area than those of the base layer and the electrode layer. For example, the as shown in FIG. 3, the functional layer 301 is formed only in a part other than an edge of the base layer 101, or as shown in FIG. 4, a part of the functional layer 302 may remain at the edge of the base layer 101.

FIG. 5 shows that the substrate of FIG. 3 is observed from above. As shown in FIG. 5, an area (A), that is, a projection area (A), of the electrode layer 302 recognized when the substrate is observed from above is larger than an area (B), that is, a projection area (B) of the functional layer 301 disposed therebelow. A ratio (A/B) of the projection area (A) of the electrode layer and the projection area (B) of the functional layer may be, for example, 1.04, 1.06, 1.08, 1.1, or 1.15 or more. When the projection area of the functional layer is smaller than that of the electrode layer, since a functional layer to be described later is possibly embodied not to be exposed to an external environment, the upper limit of the ratio (A/B) in projection area is not particularly limited. In consideration of a general environment of manufacturing a substrate, the upper limit of the ratio (A/B) may be, for example, approximately 2.0, 1.5, 1.4, 1.3 or 1.25. In the substrate, the electrode layer may be formed on the top of the base layer not having a functional layer. The electrode layer may be formed in contact with the base layer, or an additional component may be further included. According to such a structure, in the embodiment of the OED, a structure in which the functional layer is not exposed to an external environment may be embodied.

For example, as shown in FIG. 5, the electrode layer 302 may be formed in a region including a region beyond all peripheral regions of the functional layer 301 when observed from above. In this case, for example, when a plurality of functional layers are present on the base layer as shown in FIG. 4, the electrode layer may be formed up to the region including the region beyond all peripheral regions of at least one of the functional layers, for example, the functional layer on which an organic layer will be formed at least on the top thereof. For example, in the structure of FIG. 4, if an organic layer is formed on the top of the functional layer present at right and left edges, the structure of FIG. 4 extends to the left and right sides, and thus may be changed to form an electrode layer up to the region beyond all peripheral regions of the functional layer present at the right and left edges. In the above structure, when an encapsulating structure to be described later is attached to the electrode below which the functional layer is not formed, the structure in which the functional layer is not exposed to an external environment may be formed.

The electrode layer may be a conventional hole injection or electron injection electrode layer used to manufacture an OED.

The hole injection electrode layer may be formed using, for example, a material having a relatively high work function, and a transparent material when necessary. For example, the hole injection electrode layer may include a metal, an alloy, an electric conductive compound having a work function of approximately 4.0 eV or more, or a mixture of at least two thereof. Such a material may be a metal such as gold, CuI, ITO, indium zinc oxide (IZO), zinc tin oxide (ZTO), aluminum or indium-doped zinc oxide, magnesium indium oxide, nickel tungsten oxide, an oxide material such as ZnO, $SnO_2$ or $In_2O_3$, a metal nitride such as gallium nitride, a metal selenide such as zinc selenide, or a metal sulfide such as zinc sulfide. A transparent hole injection electrode layer may also be formed using a stacked structure of a metal thin film such as Au, Ag, or Cu and a highly refractive transparent material such as ZnS, $TiO_2$, or ITO.

The hole injection electrode layer may be formed by an arbitrary means such as deposition, sputtering, chemical deposition, or an electrochemical means. In addition, as needed, the formed electrode layer may be patterned through known photolithography or a process using a shadow mask.

The transparent electron injection electrode layer may be formed using, for example, a transparent material having a relatively low work function, and for example, a suitable one of the materials used to form the hole injection electrode layer may be used, but the present application is not limited thereto. The electron injection electrode layer may be formed using, for example, deposition or sputtering, and when necessary, may be suitably patterned. A thickness of the electrode layer may be, but is not particularly limited to, for example, approximately 90 to 200, 90 to 180, or 90 to 150 nm in consideration of a resistance between the above-described electrode layers.

Another aspect of the present application provides an organic electronic system. The illustrative organic electronic system of the present application may include the substrate for an OED described above, and, for example, an organic layer formed on the functional layer, high refractive layer or electrode layer, and an electrode layer formed on the organic layer, which are formed on the substrate. Hereinafter, for distinction, the electrode layer formed on the substrate may be referred to a first electrode layer, and the electrode layer formed on the organic layer may be referred to a second electrode layer. In the organic electronic system, a projection area of the first electrode layer may be larger than that of the functional layer of the substrate, and the electrode layer may be formed on a surface of the base layer not having the functional layer.

The organic layer may include at least an emitting layer. For example, when the first electrode layer is transparent, and the second electrode layer is a refractive electrode layer, a bottom-emitting device in which light generated in the emitting layer of the organic layer is radiated to the base layer through the functional layer may be embodied.

In the organic electronic system, the functional layer may have, for example, a projection area which corresponds to or is larger than that of an emitting region of the emitting layer. For example, a difference (B−C) between a length (B) of a region in which the functional layer is formed and a length (C) of the emitting region of the emitting layer may be approximately 10 μm to 2 mm. Here, the length (B) of the region in which the functional layer is formed may refer to a length in an arbitrary direction in a region recognized when the functional layer is observed from above, and in this case, the length (C) of the emitting region may refer to a length measured in the same direction as used when the length (B) of the region in which the functional layer is formed is measured also base on the region recognized when the emitting region is observed from above. The functional layer may also be formed at a position corresponding to the emitting region. For example, the phrase "the functional layer is formed at a position corresponding to the emitting region" may refer that the emitting region and the functional layer substantially overlap when an organic electronic system is observed from above or below.

In one embodiment, the OED may be an OLED. When the OED is an OLED, the OED may have, for example, a structure in which an organic layer including at least an emitting layer is intermediated between a hole injection electrode layer and an electron injection electrode layer. For example, when the electrode layer included in the substrate is a hole injection electrode layer, the second electrode layer may be an electron injection electrode layer, and in contrast, when the electrode layer included in the substrate is an electron injection electrode layer, the second electrode layer may be a hole injection electrode layer.

The organic layer present between the electron and hole injection electrode layers may include at least one emitting layer. The organic layer may include multiple, that is, at least two emitting layers. When the at least two emitting layers are included, the emitting layers may have a structure divided by an inter-electrode having a charge generating characteristic or a charge generating layer (CGL).

The emitting layer may be formed using, for example, various fluorescent or phosphorescent organic materials known in the art. An example of the material capable of being in the emitting layer may be, but is not limited to, a fluorescent material such as an Alq-based material such as tris(4-methyl-8-quinolinolate)aluminum(III) (Alg3), 4-MAlq3 or Gaq3; a cyclopenadiene derivative such as C-545T($C_{26}H_{26}N_2O_2S$), DSA-amine, TBSA, BTP, PAP-NPA, spiro-FPA, $Ph_3Si$ (PhT-DAOXD), 1,2,3,4,5-pentaphenyl-1,3-cyclopentadiene (PPCP), 4,4'-bis(2,2'-diphenylyinyl)-1,1'-biphenyl (DPVBi), distyryl benzene or a derivative thereof, or 4-(dicyanomethylene)-2-tert-butyl-6-(1,1,7,7,-tetramethyljulolidyl-9-enyl)-4H-pyran (DCJTB), DDP, AAAP or NPAMLI; or a phosphorescent material such as Firpic, m-Firpic, N-Firpic, $bon_2Ir$(acac), $(C_6)_2Ir$(acac), $bt_2Ir$(acac), $dp_2Ir$(acac), $bzq_2Ir$(acac), $bo_2Ir$(acac), $F_2Ir$(bpy), $F_2Ir$(acac), $op_2Ir$(acac), $ppy_2Ir$(acac), $tpy_2Ir$(acac), fac-tris[2-(4,5'-difluorophenyl)pyridine-C'2,N] iridium(III) (FIrppy) or bis(2-(2'-benzo[4,5-a]thienyl)pyridinato-N,C3') iridium(acetylactonate) ($Btp_2Ir$(acac)). The emitting layer may include the material as a host, and a host-dopant system including perylene, distyrylbiphenyl, DPT, quinacridone, rubrene, BTX, ABTX or DCJTB as a dopant.

The emitting layer may also be formed by employing one suitable type selected from electron accepting organic compounds and electron donating organic compounds exhibiting excellent emitting characteristics, which will be described later.

The organic layer may be formed in various structures further including various functional layers known in the art, as long as it includes the emitting layer. As a layer capable of being included in the organic layer, an electron injection layer, a hole blocking layer, an electron transport layer, a hole transport layer or a hole injection layer may be used.

The electron injection layer or electron transport layer may be formed using, for example, an electron accepting organic compound. Here, as the electron accepting organic compound, a known arbitrary compound may be used without particular limitation. As such an organic compound, a polycyclic compound such as p-terphenyl or quaterphenyl or a derivative thereof; a polycyclic hydrocarbon compound such as naphthalene, tetracene, pyrene, coronene, chrysene, anthracene, diphenylanthracene, naphthacene, or phenanthrene or a derivative thereof; or a heterocyclic compound such as phenanthroline, bathophenanthroline, phenanthridine, acridine, quinoline, quinoxaline, or phenazine or a derivative thereof. In addition, fluoroceine, perylene, phthaloperylene, naphthaloperylene, perynone, phthaloperynone, naphthaloperynone, diphenylbutadiene, tetraphenylbutadiene, oxadiazole, aldazine, bisbenzoxazoline, bisstyryl, pyrazine, cyclopentadiene, oxine, aminoquinoline, imine, diphenylethylene, vinylanthracene, diaminocarbazole, pyrane, thiopyrane, polymethine, merocyanine, quinacridone, rubrene or a derivative thereof, a metal chelate complex compound disclosed in a patent publication such as Japanese Patent Application Laid-Open No. 1988-295695, Japanese Patent Application Laid-Open No. 1996-22557, Japanese Patent Application Laid-Open No. 1996-81472, Japanese Patent Application Laid-Open No. 1993-009470 or Japanese Patent Application Laid-Open No. 1993-017764, for example, a metal complex having at least one of metal chelated oxinoid compounds such as 8-quinolatos including tris (8-quinolinolato)aluminum, bis(8-quinolinolato)magnesium, bis[benzo(f)-8-quinolinolato]zinc, bis(2-methyl-8-quinolinolato)aluminum, tris(8-quinolinolato)indium, tris(5-methyl-8-quinolinolato)aluminum, 8-quinolinolatolithium, tris(5-chloro-8-quinolinolato)gallium, bis(5-chloro-8-quinolinolato)calcium and derivatives thereof as a coordinator; an oxadiazole compound disclosed in a patent publication such as Japanese Patent Application Laid-Open No. 1993-202011, Japanese Patent Application Laid-Open No. 1995-179394, Japanese Patent Application Laid-Open No. 1995-278124 or Japanese Patent Application Laid-Open No. 1995-228579; a triazine compound disclosed in a patent publication such as Japanese Patent Application Laid-Open No. 1995-157473; a stilbene derivative disclosed in a patent publication such as Japanese Patent Application Laid-Open No. 1994-203963; a distyrylarylene derivative; a styryl derivative disclosed in a patent publication such as Japanese Patent Application Laid-Open No. 1994-132080 or Japanese Patent Application Laid-Open No. 1994-88072, a diolefin derivative disclosed in a patent publication such as Japanese Patent Application Laid-Open No. 1994-100857 or Japanese Patent Application Laid-Open No. 1994-207170; a fluorescent brightening agent such as a benzooxazole compound, a benzothiazole compound or a benzoimidazole compound; a distyrylbenzene compound such as 1,4-bis(2-methylstyryl)benzene, 1,4-bis(3-methylstyryl)benzene, 1,4-bis(4-methylstyryl)benzene, distyrylbenzene, 1,4-bis(2-ethylstyryl)benzyl, 1,4-bis(3-ethylstyryl)benzene, 1,4-bis(2-methylstyryl)-2-methylbenzene or 1,4-bis(2-methylstyryl)-2-ethylbenzene; a distyrylpyrazine compound such as 2,5-bis(4-methylstyryl)pyrazine, 2,5-bis(4-ethylstyryl)pyrazine, 2,5-bis[2-(1-naphthyl)vinyl]pyrazine, 2,5-bis(4-methoxystyryl)pyrazine, 2,5-bis[2-(4-biphenyl)vinyl]pyrazine or 2,5-bis[2-(1-pyrenyl)vinyl]pyrazine; a dimethylidine compound such as 1,4-phenylenedimethylidene, 4,4'-phenylenedimethylidene, 2,5-xylene dimethylidene, 2,6-naphthylenedimethylidene, 1,4-biphenylenedimethylidene, 1,4-para-terephenylene dimethylidene, 9,10-anthracenediyldimethylidine, or 4,4'-(2,2-di-ti-butylphenylvinyl)biphenyl, 4,4'-(2,2-diphenylvinyl) biphenyl or a derivative thereof; a silanamine derivative disclosed in a patent publication such as Japanese Patent Application Laid-Open No. 1994-49079 or Japanese Patent Application Laid-Open No. 1994-293778; a multifunctional styryl compound disclosed in a patent publication such as Japanese Patent Application Laid-Open No. 1994-279322 or Japanese Patent Application Laid-Open No. 1994-279323; an oxadiazole derivative disclosed in a patent publication such as Japanese Patent Application Laid-Open No. 1994-107648 or Japanese Patent Application Laid-Open No. 1994-092947; an anthracene compound disclosed in a patent publication such as Japanese Patent Application Laid-Open No. 1994-206865; an oxinate derivative disclosed in a patent publication such as Japanese Patent Application Laid-Open No. 1994-145146; a tetraphenyl butadiene compound disclosed in a patent publication such as Japanese Patent Application Laid-Open No. 1992-96990; an organic trifunctional compound disclosed in a patent publication such as Japanese Patent Application Laid-Open No. 1991-296595; a coumarin derivative disclosed in a patent publication such as Japanese Patent Application Laid-Open No. 1990-191694; a perylene derivative disclosed in a patent publication such as Japanese Patent Application Laid-Open No. 1990-196885; a naphthalene derivative disclosed in a patent publication such as Japanese Patent Application Laid-Open No. 1990-255789; a phthalopyrenone derivative disclosed in a patent publication such as Japanese Patent Application Laid-Open No. 1990-289676 or Japanese Patent Application Laid-Open No. 1990-88689; or a styryl amine derivative disclosed in a patent publication such as Japanese Patent Application Laid-Open No. 1990-250292 may be used as an electron accepting organic compound included in a lowly refractive layer. In addition, here, the electron injection layer may be formed using, for example, a material such as LiF or CsF.

The hole blocking layer may be a layer capable of enhancing a life span and efficiency of the device by preventing approach of holes injected from a hole injection electrode to an electron injection electrode through the emitting layer, and may be formed in a suitable part between the emitting layer and the electron injection electrode layer using a known material when necessary.

The hole injection layer or hole transport layer may include, for example, an electron donating organic compound. As the electron donating organic compound, N,N',N'-tetraphenyl-4,4'-diaminophenyl, N,N'-diphenyl-N,N'-di(3-methylphenyl)-4,4'-diaminobiphenyl, 2,2-bis(4-di-p-tollylaminophenyl)propane, N,N,N',N'-tetra-p-tollyl-4,4'-diaminobiphenyl, bis(4-di-p-tollylaminophenyl) phenylmethane, N,N'-diphenyl-N,N'-di(4-methoxyphenyl)-4,4'-diaminobiphenyl, N,N,N',N'-tetraphenyl-4,4'-diaminodiphenylether, 4,4'-bis(diphenylamino) quadriphenyl, 4-N,N-diphenylamino-(2-diphenylvinyl) benzene, 3-methoxy-4'-N,N-diphenylaminostyrylbenzene, N-phenylcarbazole, 1,1-bis(4-di-p-triaminophenyl)cyclohexane, 1,1-bis(4-di-p-triaminophenyl)-4-phenylcyclohexane, bis(4-dimethylamino-2-methylphenyl)phenylmethane, N,N,N-tri(p-tollyl)amine, 4-(di-p-tollylamino)-4'-[4-(di-p-tollylamino)styryl]stilbene, N,N,N',N'-tetraphenyl-4,4'-diaminobiphenyl N-phenylcarbazole, 4,4'-bis[N-(1-naphthyl)-N-phenylamino]biphenyl, 4,4''-bis[N-(1-naphthyl)-N-phenylamino]p-terphenyl, 4,4'-bis[N-(2-naphthyl)-N-phenylamino]biphenyl, 4,4'-bis[N-(3-acenaphthenyl)-N-phenylamino]biphenyl, 1,5-bis[N-(1-naphthyl)-N-phenylamino]naphthalene, 4,4'-bis[N-(9-anthryl)-N-phenylamino]biphenylphenylamino]biphenyl, 4,4''-bis[N-(1-anthryl)-N-phenylamino]-p-terphenyl, 4,4'-bis[N-(2-phenanthryl)-N-phenylamino]biphenyl, 4,4'-bis[N-(8-fluoranthenyl)-N-phenylamino]biphenyl, 4,4'-bis[N-(2-pyrenyl)-N-phenylamino]biphenyl, 4,4'-bis[N-(2-perylenyl)-N-phenylamino]biphenyl, 4,4'-bis[N-(1-coronenyl)-N-phenylamino]biphenyl, 2,6-bis(di-p-tollylamino)naphthalene, 2,6-bis[di-(1-naphthyl)amino] naphthalene, 2,6-bis[N-(1-naphthyl)-N-(2-naphthyl)amino] naphthalene, 4,4''-bis[N,N-di(2-naphthyl)amino]terphenyl, 4,4-bis{N-phenyl-N-[4-(1-naphthyl)phenyl]
amino}biphenyl, 4,4'-bis[N-phenyl-N-(2-pyrenyl)amino]biphenyl, 2,6-bis[N,N-di-(2-naphthyl)amino]fluorine or 4,4''-bis(N,N-di-p-tollylamino)terphenyl, or an aryl amine compound such as bis(N-1-naphthyl)(N-2-naphthyl)amine may be used, but the present application is not limited thereto.

The hole injection layer or hole transport layer may be formed by dispersing the organic compound in a polymer, or using a polymer derived from the organic compound. In addition, a π-conjugated polymer such as polyparaphenylenevinylene and a derivative thereof, a hole transport non-conjugated polymer such as poly(N-vinylcarbazole) or a σ-conjugated polymer of polysilane may also be used.

The hole injection layer may be formed using an electrically-conductive polymer such as a metal phthalocyanine such as copper phthalocyanine or a non-metal phthalocyanine, a carbon layer and polyaniline, or may be formed by reaction with a Lewis acid using the aryl amine compound as an oxidizing agent.

For example, the OLED may be formed in a type of (1) a hole injection electrode layer/an organic emitting layer/an electron injection electrode layer; (2) a hole injection electrode layer/a hole injection layer/an organic emitting layer/an electron injection electrode layer; (3) a hole injection electrode layer/an organic emitting layer/an electron injection layer/an electron injection electrode layer; (4) a hole injection electrode layer/a hole injection layer/an organic emitting layer/an electron injection layer/an electron injection electrode layer; (5) a hole injection electrode layer/an organic semiconductor layer/an organic emitting layer/an electron injection electrode layer; (6) a hole injection electrode layer/ an organic semiconductor layer/an electron barrier layer/an organic emitting layer/an electron injection electrode layer; (7) a hole injection electrode layer/an organic semiconductor layer/an organic emitting layer/an adhesion-improving layer/ an electron injection electrode layer; (8) a hole injection electrode layer/a hole injection layer/a hole transport layer/an organic emitting layer/an electron injection layer/an electron injection electrode layer; (9) a hole injection electrode layer/ an insulating layer/an organic emitting layer/an insulating layer/an electron injection electrode layer; (10) a hole injection electrode layer/an inorganic semiconductor layer/an insulating layer/an organic emitting layer/an insulating layer/ an electron injection electrode layer; (11) a hole injection electrode layer/an organic semiconductor layer/an insulating layer/an organic emitting layer/an insulating layer/an electron injection electrode layer; (12) a hole injection electrode layer/an insulating layer/a hole injection layer/a hole transport layer/an organic emitting layer/an insulating layer/an electron injection electrode layer or (13) a hole injection electrode layer/an insulating layer/a hole injection layer/a hole transport layer/an organic emitting layer/an electron injection layer/an electron injection electrode layer, which are sequentially formed, and in some cases, the OLED may have an organic layer having a structure in which at least two emitting layers are divided by an inter-electrode layer having a charge generating characteristic or CGL between a hole injection electrode layer and an electron injection electrode layer, but the present application is not limited thereto.

Various materials for forming a hole or electron injection electrode layer and an organic layer, for example, an emitting layer, an electron injection or transport layer, or a hole injection or transport layer and methods of forming the same are known in the art, and all of the above-described methods may be applied to manufacture the organic electronic system.

The organic electronic system may further include an encapsulating structure. The encapsulating structure may be a protective structure for preventing inflow of an external material such as moisture or oxygen to the organic layer of the organic electronic system. The encapsulating structure may be, for example, a can such as a glass can or a metal can, or a film covering an entire surface of the organic layer.

FIG. 6 shows that an organic layer 701 and a second electrode layer 702 formed on a substrate including a base layer 101, a functional layer 301 and a first electrode layer 302, which are sequentially formed, are protected by an illustrative encapsulating structure 703 formed in a can structure such as a glass can or a metal can. For example, the encapsulating structure 703 of FIG. 6 may be attached by an adhesive. The encapsulating structure 703 may be adhered to the substrate, for example, the electrode layer below which the functional layer is not present. For example, the encapsulating structure 703 as shown in FIG. 6 may be attached to an end of the substrate by an adhesive. According to such a method, a protecting effect by the encapsulating structure may be optimized.

The encapsulating structure may be, for example, a film coating entire surfaces of an organic layer and a second electrode layer. FIG. 7 shows an illustrative film-type encapsulating structure 703 covering entire surfaces of an organic layer 701 and a second electrode layer 702. For example, as shown in FIG. 7, the film-type encapsulating structure 703 may cover the entire surfaces of the organic layer 701 and the second electrode layer 702, and have a structure in which the substrate including the base layer 101, the functional layer 701 and the second electrode layer 702 is adhered to a second substrate 801 disposed thereon. For example, as the second substrate 801, a glass substrate, a metal substrate, a polymer film or a barrier layer may be used. The film-type encapsulating structure may be formed by, for example, coating a liquid material cured by heat or UV irradiation such as an epoxy resin and curing the liquid material, or laminating the substrate with the upper substrate using an adhesive sheet previously manufactured in a film type using the epoxy resin.

The encapsulating structure may include a water adsorbent or getter such as a metal oxide such as calcium oxide or beryllium oxide, a metal halide such as calcium oxide, or phosphorus pentoxide, when necessary. For example, the water adsorbent or getter may be included in the film-type encapsulating structure, or present at a predetermined position of a can-type encapsulating structure. The encapsulating structure may further include a barrier film or a conductive film.

As shown in FIG. 6 or 7, the encapsulating structure may be attached to, for example, the top of the first electrode layer 302 below which the functional layer 301 is not formed. Accordingly, a sealing structure in which the high refractive layer is not exposed to an external environment may be embodied. The sealing structure may refer to, for example, a state in which the entire surface of the high refractive layer is not exposed to an external environment by being surrounded by the base layer, the electrode layer and/or the encapsulating structure, or by being surrounded by the sealing structure formed to include the base layer, the electrode layer and/or the encapsulating structure. The sealing structure may be formed to only include the base layer, the electrode layer and/or the encapsulating structure, or to include the base layer, the electrode layer, the encapsulating structure, and also another component, for example, an auxiliary electrode as long as the high refractive layer is not exposed to an external environment. For example, in FIG. 6 or 7, another component may be present at a part in which the base layer 101 is in contact with the electrode layer 302 or the electrode 302 is in contact with the encapsulating structure 703 or another position. As the another component, an organic, inorganic or organic/inorganic combination material having a low water permeability, an insulating layer or an auxiliary electrode may be used.

Still another aspect of the present application provides a method of manufacturing a substrate for an OED or an OED. The illustrative method may include forming a functional layer on a base layer. For example, the functional layer may be formed by forming a coating layer including a glass frit capable of forming a sintered product having an absolute value of a difference in a refractive index from a glass substrate of 1.0 or less and scattering particles having a refractive index of 2.0 to 3.5 with respect to light having a wavelength of 550 nm and an average diameter of 50 nm or more on a glass substrate, and sintering the coating layer.

Here, the coating layer may be formed by coating a coating material prepared by mixing the glass frit with the scattering particles on the glass substrate by a suitable method. The kind of the glass frit capable of being used in this operation is not particularly limited. Various kinds of glass frit capable of embodying a refractive index in the various ranges are known in the related arts, and suitable one may be selected from the glass frits.

The above-described functional layer may be formed by sintering the coating layer. A method of sintering the coating layer may be, but is not particularly limited to, for example, thermal treatment of the coating layer or laser blazing.

Conditions for the thermal treatment and laser blazing treatment are not particularly limited as long as a suitable sintered layer will be formed. For example, the thermal treatment may be performed by maintaining the coating layer at a temperature of approximately 300 to 500° C. for approximately 30 minutes to 3 hours. In addition, the method of performing laser blazing may be performed using a known apparatus such as a high power laser diode with a laser having a peak wavelength of approximately 300 to 500 nm or 800 nm or more, but the present application is not particularly limited thereto.

After the sintering, the above-described high refractive layer may be formed on the sintered coating layer. In this operation, a method of forming the high refractive layer is not particularly limited, and thus the above-described forming method or various other methods known in the art may be applied.

The manufacturing method may further include forming an electrode layer after the functional layer or high refractive layer is formed. A method of forming the electrode layer may be an arbitrary method such as known deposition, sputtering, chemical deposition or electrochemical methods, but the present application is not particularly limited thereto.

The method of manufacturing an OED may include forming an organic layer including an emitting layer and a second electrode layer after the electrode layer is formed as described above, and further forming an encapsulating structure. In this case, the organic layer, the second electrode layer and the encapsulating structure may be formed by a known method.

Yet another aspect of the present application provides a use of the above-described organic electronic system, for example, the organic light emitting system. The organic light emitting system may be effectively applied to a backlight of a liquid crystal display (LCD), lightings, sensors, printers, a light source of a copy machine, a light source for an automobile gauge, a signal light, a pilot lamp, a display device, a light source for a planar emitting device, a display, decorations or other kinds of lights. In one embodiment, the present application relates to a lighting device including the OLED. When the OLED is applied to the lighting device or for different uses, other components constituting the device or a method of constituting the device is not particularly limited, but all of arbitrary materials or methods known in the related art may be employed as long as these are used in the OLED.

Effect

According to the present application, a substrate for an OED having a functional layer which can improve a function such as light extraction efficiency of an organic electronic system such as OLED and stability of the device due to excellent cohesive strength to the substrate can be provided. In addition, an organic electronic system including the substrate and a use thereof can be provided.

DESCRIPTION OF THE MARKS

Figure 1:
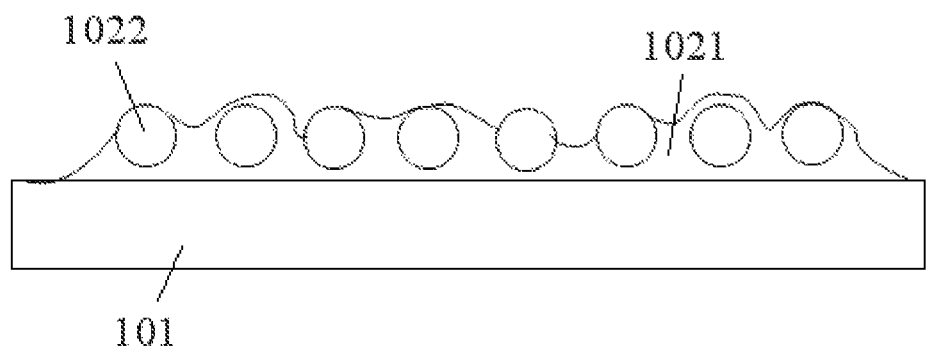
FIGS. 1 and 2 are schematic diagrams of illustrative substrates for an OED.
Figure 2:
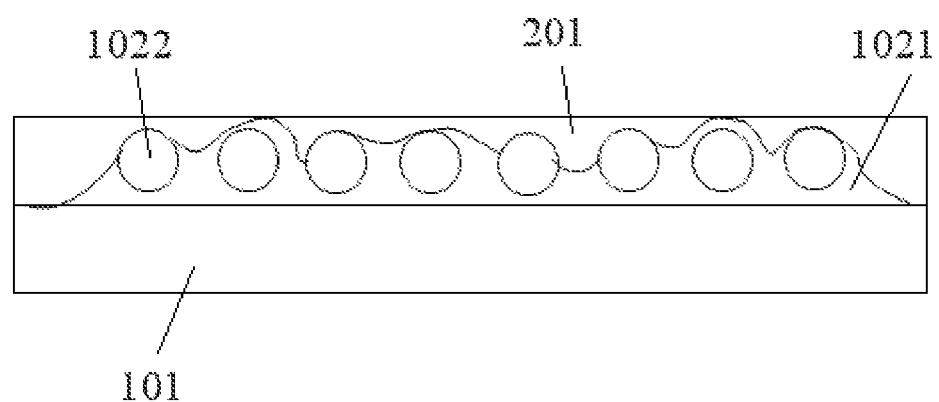
Figure 3:
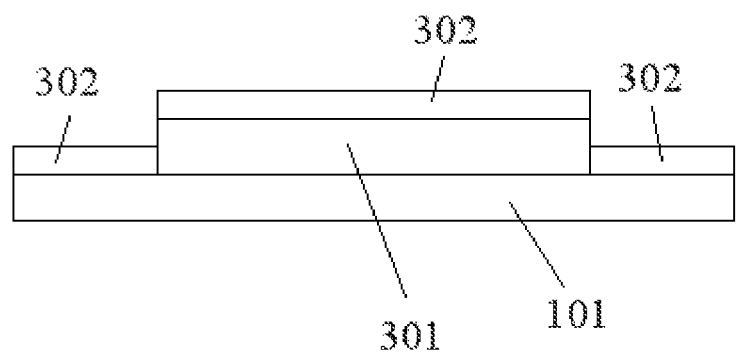
FIGS. 3 to 5 show a relationship in projection area between a functional layer and an electrode layer.
Figure 4:
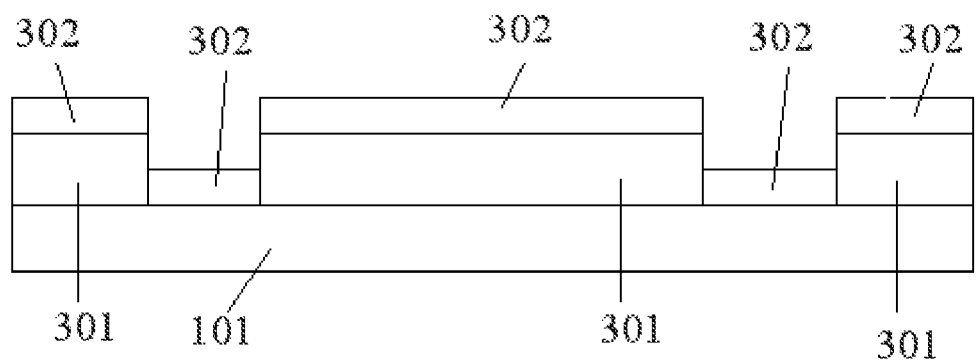
Figure 5:
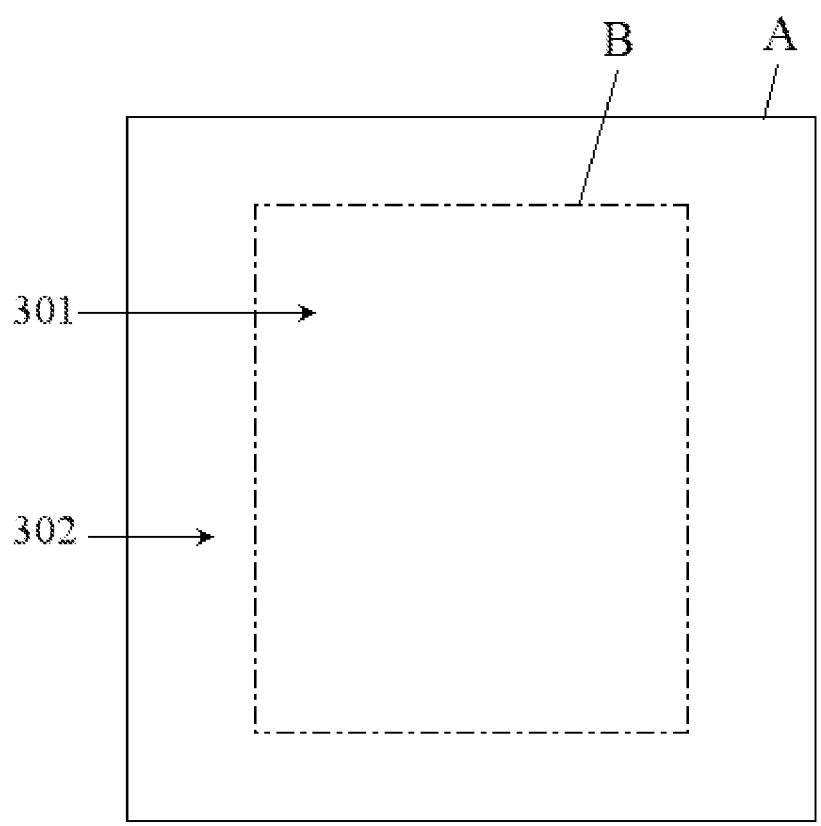
Figure 6:
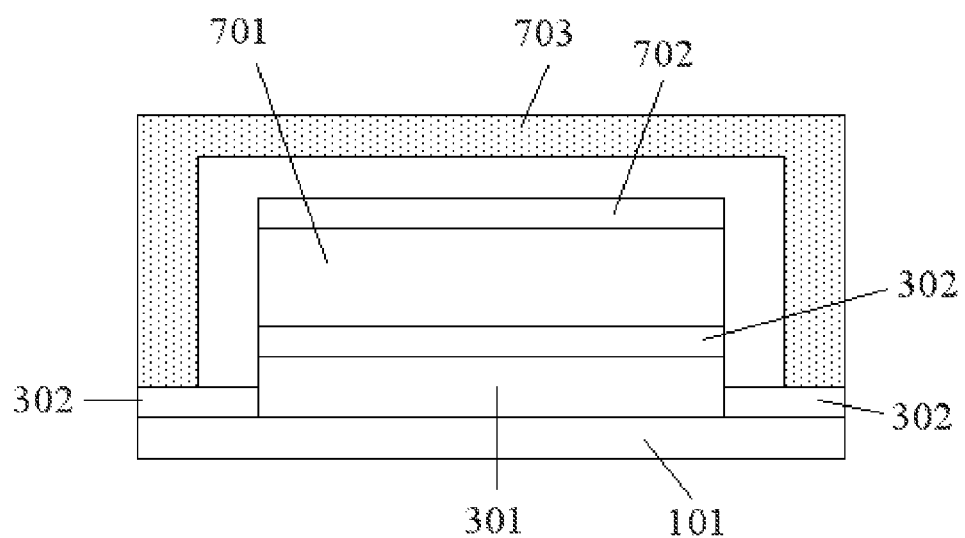
FIGS. 6 and 7 are diagrams of illustrative organic electronic systems.
Figure 7:
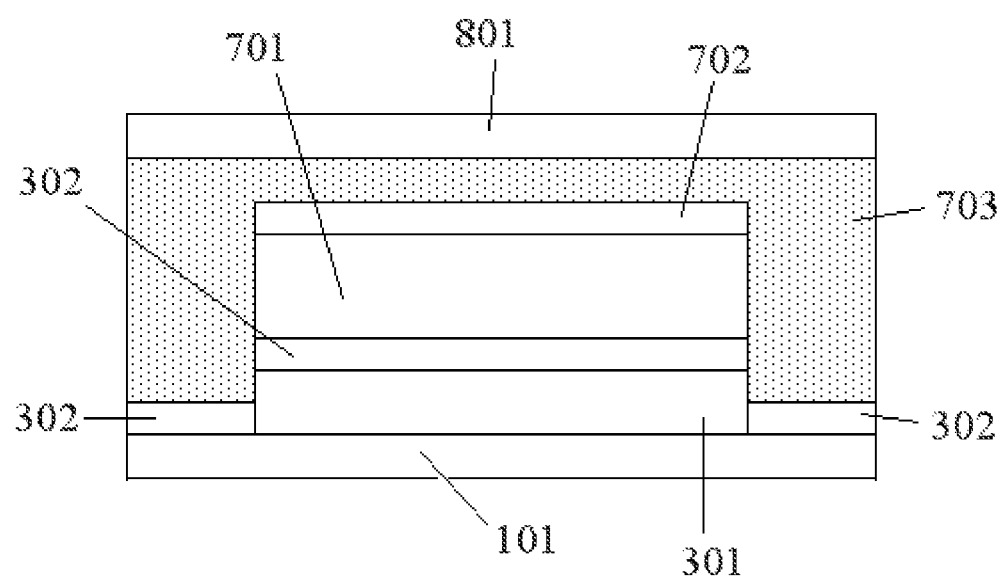

101: the base layer
1021: the sintered product
1022: the scattering particle
201: the high refractive layer
301: the functional layer
302: the electrode layer, the first electrode layer
701: the organic layer
702: the second electrode layer
703: the encapsulating structure
801: the second substrate

ILLUSTRATIVE EMBODIMENTS

Hereinafter, a substrate for an OED will be described in detail with reference to Example and Comparative Examples, but the scope of the substrate is not limited to the following Example.

Example 1

Manufacture of Substrate for OED

A coating material was prepared by blending 10 g of a glass frit capable of a sintered product having a refractive index of approximately 1.6 and 1 g of scattering particles ($TiO_2$) having a refractive index of approximately 2.7 and an average diameter of approximately 200 nm. Subsequently, the prepared coating material was coated to a thickness such that an uneven structure could be formed on a surface of the glass substrate by the scattering particles, and then sintered at approximately 400° C. or more for approximately 1 hour. Subsequently, a high refractive layer having a refractive index of approximately 1.8 was formed by coating a coating material prepared by blending highly refractive titanium oxide particles having an average diameter of approximately 10 nm and a refractive index of approximately 2.5 to tetramethoxy silane as a condensable silane on the sintered coating layer, and performing a sol-gel reaction. Afterward, a hole injection electrode layer including ITO was formed on an entire surface of the glass substrate by a known sputtering method, thereby completing a substrate.

Manufacture of OLED

A hole injection layer including N,N'-Di-[(1-naphthyl)-N, N'-diphenyl]-1,1'-biphenyl)-4,4'-diamine (α-NPD) and an emitting layer (4,4',4"-tris(N-carbazolyl)-triphenylamine (TCTA):Firpic; TCTA:Fir6) were sequentially formed on an electrode layer of the manufactured substrate by a deposition method. Subsequently, a lowly refractive organic layer was formed to a thickness of approximately 70 nm by co-depositing an electron transport compound (4,4',4"-tris(N-carbazolyl)-triphenylamine; TCTA) and a lowly refractive material (LiF) having a refractive index of approximately 1.39 on the top of the emitting layer to have a refractive index of the entire layer of approximately 1.66. Afterward, a device was manufactured by forming an aluminum (Al) electrode as an electron injection reflective electrode on the top of the lowly refractive organic layer by a vacuum deposition method. An encapsulating structure was then attached to the device in a glove box in an Ar gas atmosphere, thereby completing a system.

Comparative Example 1

An OLED was manufactured as described in Example 1, except that a functional layer and a high refractive layer were not formed.

Results of the evaluation of performance with respect to Examples and Comparative Example are shown in Table 1. In Table 1, evaluation of absolute quantum efficiency was performed by a known method.

TABLE 1

|  | Drive voltage (V) | Absolute quantum efficiency (%) |
|---|---|---|
| Example 1 | 2.7 | 48.1 |
| Comparative Example 1 | 2.8 | 29 |

What is claimed is:

1. A substrate for an organic electronic device, comprising:
a glass substrate; and
a functional layer which is formed on the glass substrate, and which comprises a sintered product of a glass frit, an absolute value of a difference in refractive index between the glass substrate and the sintered product being 1.0 or less, and a scattering particle that is comprised in the sintered product and that has a refractive index with respect to light having a wavelength of 550 nm of 2.0 to 3.5 and an average diameter of 50 nm or more,
wherein the sintered product of the glass frit has a refractive index with respect of light having a wavelength of 550 nm of 1.3 to 1.7.

2. The substrate according to claim 1, wherein an average diameter of at least one scattering particle is larger than a thickness of the functional layer, and thereby an uneven structure is formed on a surface of the functional layer.

3. The substrate according to claim 1, further comprising: a high refractive layer formed on the functional layer.

4. The substrate according to claim 3, wherein the high refractive layer has a refractive index with respect to light having a wavelength of 550 nm of 1.8 to 3.5.

5. The substrate according to claim 3, wherein an absolute value of a difference in refractive index between the high refractive layer and the scattering particles is more than 0.3.

6. The substrate according to claim 1, further comprising: an electrode layer formed on the functional layer.

7. An organic electronic device, comprising:
the substrate of claim 1;
a first electrode layer formed on the substrate;
an organic layer formed on the first electrode layer; and
a second electrode layer formed on the organic layer.

8. The organic electronic device according to claim 7, wherein the organic layer comprises an emitting layer.

9. Lighting comprising the organic electronic device of claim 7.

10. A method of manufacturing a substrate for an organic electronic device, comprising: forming a coating layer comprising a glass frit capable of forming a sintered product having an absolute value of a difference in refractive index between a glass substrate and the sintered product of 1.0 or less, and a scattering particle having a refractive index with respect to light having a wavelength of 550 nm of 2.0 to 3.5 and an average diameter of 50 nm or more on a glass substrate; and sintering the coating layer,
wherein the sintered product of the glass frit has a refractive index with respect of light having a wavelength of 550 nm of 1.3 to 1.7.

11. The method according to claim 10, wherein the sintering of the coating layer is performed by thermal treatment or laser blazing.

12. The method according to claim 11, wherein the thermal treatment is performed by maintaining the coating layer at a temperature of 300° C. to 500° C. for 30 minutes to 3 hours.

13. The method according to claim 10, further comprising: forming a high refractive layer having a refractive index with respect to light having a wavelength of 550 nm of 1.8 to 3.5 on the plasticized coating layer.

* * * * *